US012690368B2

(12) United States Patent
Liu

(10) Patent No.: US 12,690,368 B2
(45) Date of Patent: Jul. 21, 2026

(54) DISPLAY PANELS AND DISPLAY DEVICES

(71) Applicant: Shenzhen China Star Optoelectronics Semiconductor Display Technology Co., Ltd., Shenzhen (CN)

(72) Inventor: Ying Liu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 436 days.

(21) Appl. No.: 18/474,271

(22) Filed: Sep. 26, 2023

(65) Prior Publication Data

US 2024/0215389 A1     Jun. 27, 2024

(30) Foreign Application Priority Data

Dec. 23, 2022     (CN) .......................... 202211667777.4

(51) Int. Cl.
H10K 59/80          (2023.01)
(52) U.S. Cl.
CPC ....... H10K 59/8722 (2023.02); H10K 59/873 (2023.02)
(58) Field of Classification Search
CPC ............. H10K 59/8722; H10K 59/873; H10K 50/8426; H10K 50/844
See application file for complete search history.

(56) References Cited

U.S. PATENT DOCUMENTS

| | | | | |
|---|---|---|---|---|
| 2003/0222575 A1* | 12/2003 | Yamazaki | .............. | H10K 50/85 |
| | | | | 257/E27.111 |
| 2005/0073247 A1* | 4/2005 | Yamazaki | .............. | H10K 50/17 |
| | | | | 313/506 |
| 2019/0067629 A1* | 2/2019 | Wu | ...................... | H10K 59/874 |
| 2020/0183205 A1 | 6/2020 | Chen et al. | | |

FOREIGN PATENT DOCUMENTS

| | | |
|---|---|---|
| CN | 107565066 A | 1/2018 |
| CN | 108962947 A | 12/2018 |
| CN | 115356878 A | 11/2022 |

OTHER PUBLICATIONS

Chinese Office Action issued in corresponding Chinese Patent Application No. 202211667777.4 dated Jul. 12, 2025, pp. 1-7.

* cited by examiner

*Primary Examiner* — Anne M Hines
*Assistant Examiner* — Jose M Diaz
(74) *Attorney, Agent, or Firm* — Nathan & Associates Patent Agents Ltd.; Menachem Nathan

(57)          ABSTRACT

Display panels and display devices are provided. The display panel includes a substrate, a driving circuit layer including a circuit unit disposed in a non-display area, a first organic layer including a first covering part and a retaining wall part arranged at intervals, a waterproof layer, and a sealant disposed in the non-display area. The first covering part extends to the non-display area. The waterproof layer covers the retaining wall part. The sealant is disposed on sides of the driving circuit layer and the waterproof layer (Continued)

away from the substrate. An orthographic projection of the sealant on the substrate overlaps with an orthographic projection of the retaining wall part on the substrate, and an orthographic projection of an end of the circuit unit away from a display area on the substrate is located within the orthographic projection of the retaining wall part on the substrate.

20 Claims, 3 Drawing Sheets

DISPLAY PANELS AND DISPLAY DEVICES

CROSS-REFERENCE TO RELATED APPLICATION

This application claims priority to Chinese Patent Application No. 202211667777.4, filed on Dec. 23, 2022, the disclosure of which is incorporated herein by reference in its entirety.

TECHNICAL FIELD

The present disclosure relates to the field of display technologies, and in particular, to display panels and display devices.

BACKGROUND

Organic light emitting diode (OLED) display devices have attracted much attention in the industry due to their self-luminescence, low driving voltage, fast response, and wide viewing angle. Organic light emitting materials are very sensitive to water and oxygen, and the presence of trace amounts of moisture may lead to a serious decline in display quality or even complete failure, so packaging is very important for OLEDs.

An existing Dam/Getter/Fill packaging method for an OLED display panel is to apply a circle of dam glue on a cover plate, then drop fill glue in the circle enclosed by the dam glue, and then press the cover plate and the substrate for UV irradiation to cure the glue material to reach sealing effect. The OLED display panel generally includes a gate driver on array (GOA) circuit unit located in a non-display area of the display panel and adjacent to a sealant, and includes an organic layer covering the GOA circuit unit to provide protection for the GOA circuit unit. However, the organic layer is arranged outside the sealant to ensure effective encapsulation of the sealant or overlaps with the sealant to improve the protection of organic layer against the GOA circuit unit. It is difficult to ensure well protection for the GOA circuit unit and effective encapsulation of the sealant at the same time.

SUMMARY

In view of above, display panels are provided according to embodiments of the present disclosure. The display panel includes a display area and a non-display area, and includes a substrate, a driving circuit layer, a first organic layer, a waterproof layer, and a sealant. The driving circuit layer is disposed on the substrate and includes a circuit unit disposed in the non-display area. The first organic layer includes a first covering part and a retaining wall part both disposed on a side of the circuit unit away from the substrate. The first covering part is disposed in the display area and extends to the non-display area. The retaining wall part is disposed on a lateral side of the first covering part away from the display area and spaced apart from the first covering part. The waterproof layer covers the retaining wall part. The sealant is disposed in the non-display area and disposed on a side of the driving circuit layer away from the substrate and a side of the waterproof layer away from the substrate. An orthographic projection of the sealant on the substrate overlaps with an orthographic projection of the retaining wall part on the substrate, and an orthographic projection of an end of the circuit unit away from the display area on the substrate is located within the orthographic projection of the retaining wall part on the substrate.

Display devices are further provided according to embodiments of the present disclosure. The display device includes the above-mentioned display panel.

DETAILED DESCRIPTION

Figure 1:
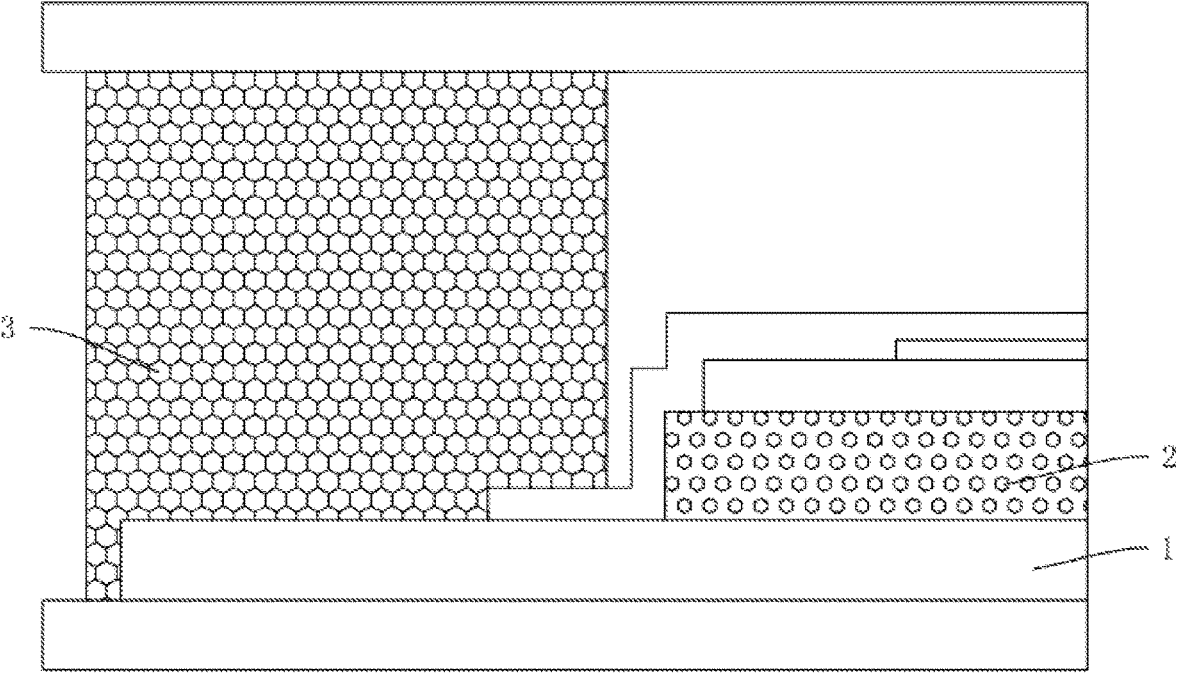
FIG. 1 is a structural schematic view of a display panel provided in the related art.

Technical solutions in the embodiments of the present disclosure will be clearly and completely described below with reference to the accompanying drawings. Obviously, the described embodiments are only some of the embodiments of the present disclosure, not all of them. Based on the embodiments in the present disclosure, all other embodiments obtained by those skilled in the art without making creative efforts belong to the scope of protection of this application.

Different embodiments or examples are provided in the following disclosure to implement different structures of the present disclosure. To simplify the disclosure of the present disclosure, components and arrangements of specific examples are described below. Of course, they are merely examples, and are not intended to limit the present disclosure. Furthermore, the present disclosure may repeat reference numerals and/or reference letters in different examples, such repetition is for simplicity and clarity and does not in itself indicate a relationship between the various embodiments and/or arrangements discussed. In addition, this disclosure provides examples of various specific processes and materials, but one of ordinary skill in the art may recognize the use of other processes and/or the use of other materials.

Referring to FIG. 1, in related art, a gate driver on array (GOA) circuit unit 1 is located in a non-display area of the display panel, and an organic layer 2 covers the GOA circuit unit 1 to provide protection for the GOA circuit unit 1, such as stress buffering and electrostatic protection. The GOA circuit unit 1 is disposed adjacent to a sealant 3 (that is the Dam glue), since the organic layer 2 is made of organic materials and does not have a water blocking effect, the organic layer 2 is often arranged outside the sealant 3, so as to ensure effective encapsulation of the sealant 3. However, this arrangement will result in a part of the GOA circuit unit 1 not being covered by the organic layer 2, resulting in a reduction in the protection effect of the organic layer 2 on the GOA circuit unit 1, resulting in a decrease in the yield of the display panel.

Figure 2:
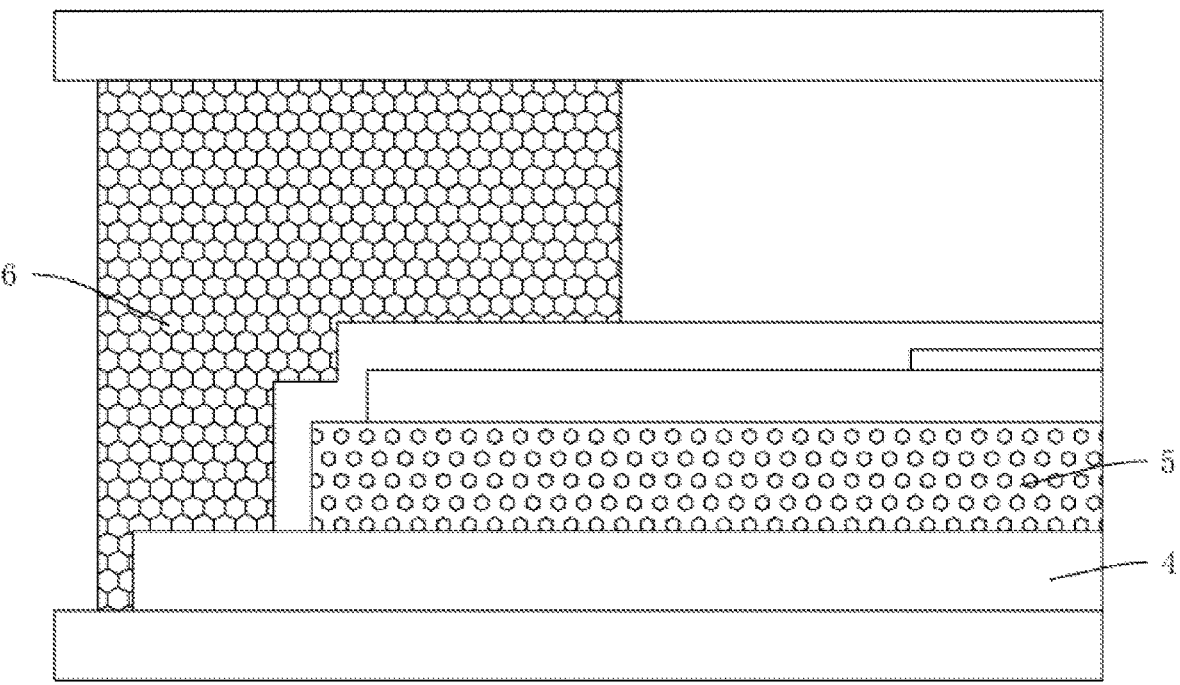
FIG. 2 is a structural schematic view of another display panel provided in the related art.

Referring to FIG. 2, in the related art, in order to improve the protection effect of the organic layer 5 on the GOA circuit unit 4, a coverage of the organic layer 5 is increased by extending into a coverage of the sealant 6. As a result, a distance between a boundary of the organic layer 5 and an outer boundary of the sealant 6 is reduced, since the organic layer 5 does not have a water blocking effect, so that a packaging distance of the sealant 6 is reduced, and the encapsulation effect of the sealant 6 is reduced. Water vapor may be easy to invade into the GOA circuit unit 4, which also leads to a reduction of the yield of the display panel.

Therefore, in the related art, it is difficult to ensure well protection for the GOA circuit unit and effective encapsulation of the sealant at the same time.

Figure 3:
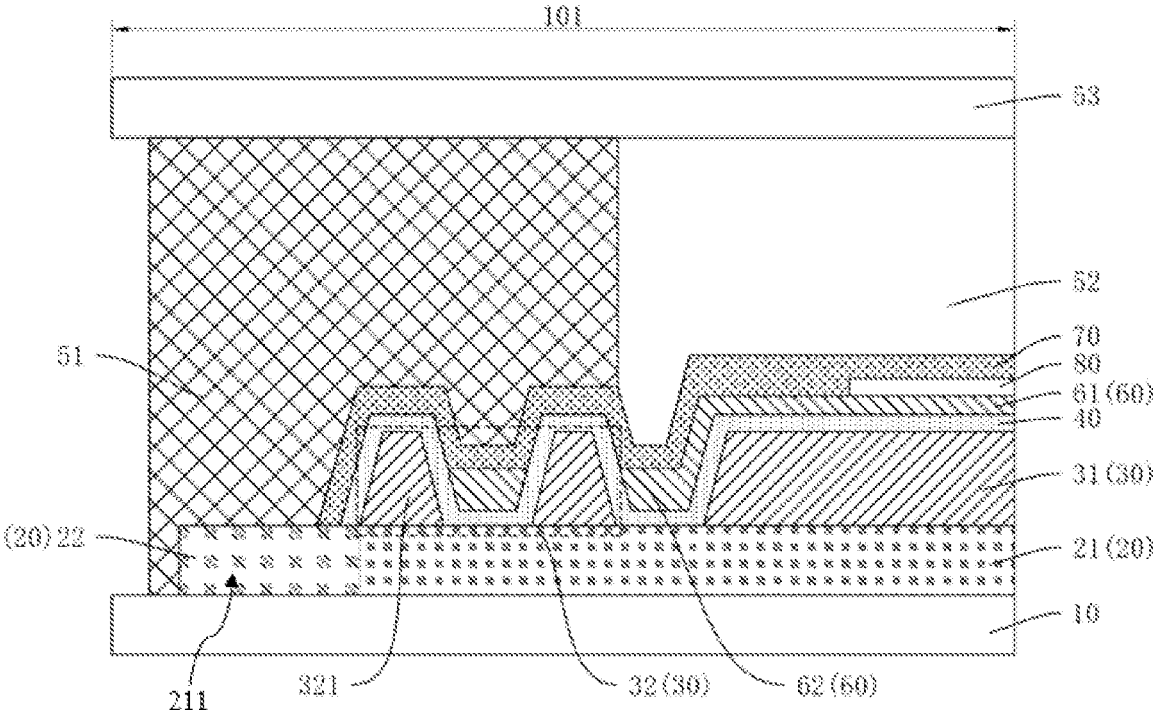
FIG. 3 is a structural schematic view of a display panel according to an embodiment of the present disclosure.

A display panel is provided in embodiments of the present disclosure. Referring to FIG. 3, the display panel according to the embodiments of the present disclosure includes a display area (not illustrated in the figures) and a non-display area 101.

The display panel includes a substrate 10, a driving circuit layer 20, a first organic layer 30, a waterproof layer 40, and a sealant 51. The driving circuit layer 20 is disposed on the substrate 10 and includes a circuit unit 21 arranged in the non-display area 101. The first organic layer 30 includes a first covering part 31 and a retaining wall part 32. The first covering part 31 and the retaining wall part 32 are disposed on a side of the circuit unit 21 away from the substrate 10. The first covering part 31 is arranged in the display area and extends into the non-display area 101. The retaining wall part 32 is arranged on a lateral side of the first covering part 31 away from the display area and is spaced apart from the first covering part 31. The waterproof layer 40 covers the retaining wall part 32. The sealant 51 is arranged in the non-display area 101 and disposed on sides of the driving circuit layer 20 and the waterproof layer 40 away from the substrate 10.

In some embodiments, an orthographic projection of the sealant 51 on the substrate 10 overlaps with an orthographic projection of the retaining wall part 32 on the substrate 10. An orthographic projection of an end 211 of the circuit unit 21 away from the display area on the substrate 10 is located within the orthographic projection of the retaining wall part 32 on the substrate 10.

In the embodiments of the present disclosure, a portion of the first organic layer 30 located in the non-display area 101 is divided into the first covering part 31 and the retaining wall part 32 arranged at intervals, so the portion of the first organic layer 30 located in the non-display area 101 is cut off. Because the first organic layer 30 is made of an organic material, it does not have a water blocking effect. In the embodiments of the present disclosure, the first covering part 31 and the retaining wall part 32 are arranged at intervals to break a water vapor intrusion channel, and the waterproof layer 40 is provided to cover the retaining wall part 32, so as to block the water vapor intrusion channel in the first organic layer 30, thereby effectively improving the encapsulation effect for the circuit unit 21. At the same time, a boundary of the circuit unit 21 is located within a coverage of the retaining wall part 32, thereby increasing a coverage of the first organic layer 30 to the circuit unit 21, which may ensure the protection effect of the first organic layer 30 on the circuit unit 21, and may further improve a yield rate of the display panel.

In some embodiments of the present disclosure, the display area may be located on a right side of the non-display area 101 as illustrated in FIG. 3. The display panel further includes a package substrate 53 disposed opposite to the substrate 10, and a second organic layer 60, a cathode layer 80, and an encapsulation layer 70 disposed between the substrate 10 and the package substrate 53.

The sealant 51 is arranged between the substrate 10 and the package substrate 53, and is located in a boundary area, so as to define an enclosed area surrounded by the sealant 51 and between the substrate 10 and the package substrate 53. Functional film layers of the display panel, such as the driving circuit layer 20, the first organic layer 30, the second organic layer 60, the cathode layer 80, and the encapsulation layer 70, are arranged on a side of the substrate 10 adjacent to the package substrate 53, and are located in the enclosed area. Some of the functional film layers may further extend to the boundary area of the substrate 10 and overlap with the sealant 51 in a thickness direction of the display area. That is, the sealant 51 also covers surfaces of the some of the functional film layers (which extends to the boundary area) away from the substrate 10. In addition, the display panel further includes a filling glue 52 covering the above-mentioned functional film layers. The filling glue 52 is also located in the enclosed area surrounded by the sealant 51.

The driving circuit layer 20 is disposed on the side of the substrate 10 adjacent to the package substrate 53. The first organic layer 30 is disposed on a side of the driving circuit layer 20 adjacent to the package substrate 53. The second organic layer 60 is disposed on a side of the first organic layer 30 adjacent to the package substrate 53. The cathode layer 80 is disposed on a side of the second organic layer 60 adjacent to the package substrate 53. The encapsulation layer 70 is disposed on a side of the cathode layer 80 adjacent to the package substrate 53. A side of the sealant 51 away from the substrate 10 is attached to the package substrate 53. A side of the sealant 51 adjacent to the substrate 10 covers a portion of the substrate 10 extending to the boundary area and overlapping with the sealant 51, the driving circuit layer 20, and the encapsulation layer 70. The filling glue 52 is arranged in the enclosed area and covers the encapsulation layer 70.

The driving circuit layer 20 includes a pixel driving circuit located in the display area and the circuit unit 21 located in the non-display area 101. In some embodiments, the circuit unit 21 may include a GOA driving circuit unit.

In some embodiments, the driving circuit layer 20 further includes a wiring unit 22 located on a lateral side of the circuit unit 21 away from the display area. The orthographic projection of the sealant 51 on the substrate 10 covers an orthographic projection of the wiring unit 22 on the substrate 10. The wiring unit 22 includes a plurality of signal wirings. An end of each signal wiring may be connected to the circuit unit 21, and the other end of each signal wiring may be connected to a bonding area of the display panel and electrically connected to a driving module, so as to realize a transmission of electrical signals between the driving module and the circuit unit 21.

The first organic layer 30 covers a side of the driving circuit layer 20 away from the substrate 10 and includes the first covering part 31 and the retaining wall part 32. The first covering part 31 is located in the display area and extends to the non-display area 101. The retaining wall part 32 is located on a lateral side of the first covering part 31 away from the display area. The retaining wall part 32 and the first covering part 31 are arranged at intervals. The first covering part 31 and the retaining wall part 32 cover a part of the circuit unit 21 located in the non-display area 101. An orthographic projection of the end 211 of the circuit unit 21 away from the display area on the substrate 10 is located within the orthographic projection of the retaining wall part 32 on the substrate 10.

In some embodiments, the first organic layer 30 may be a planarization layer of the display panel, specifically, it is made of an organic material, and its function may cover a portion of the driving circuit layer 20 located in the display area and provide a flat surface to improve a yield rate of subsequent films. The first organic layer 30 may cover a part of the circuit unit 21 in the non-display area 101 to provide protection for the circuit unit 21, such as stress buffering and electrostatic protection.

In some embodiments, the sealant 51 overlaps with the circuit unit 21 and overlaps with the first organic layer 30. Specifically, the sealant 51 overlaps with the retaining wall part 32. An orthographic projection of the sealant 51 on the substrate 10 may overlap with an orthographic projection of the retaining wall part 32 on the substrate 10; or the orthographic projection of the sealant 51 on the substrate 10 may cover the orthographic projection of the retaining wall part 32 on the substrate 10; or the orthographic projection of the sealant 51 on the substrate 10 may cover the orthographic projection of the retaining wall part 32 on the substrate 10 and overlap with an orthographic projection of the first covering part 31 on the substrate 10.

In some embodiments of the present disclosure, the display panel further includes a waterproof layer 40 arranged between the first organic layer 30 and the second organic layer 60. The waterproof layer 40 has the function of blocking water vapor and covers the retaining wall part 32. The first organic layer 30 is made of an organic material. Compared with the related art illustrated in FIG. 1, in the embodiments of the present disclosure, a coverage of the first organic layer 30 on the circuit unit 21 is increased, so that there is an overlapping portion between the first organic layer 30 and the sealant 51, which improves the protection effect of the first organic layer 30 on the circuit unit 21. Furthermore, in the embodiments of the present disclosure, the portion of the first organic layer 30 located in the non-display area 101 is divided into the first covering part 31 and the retaining wall part 32, thereby separating the water vapor intrusion channel in the first organic layer 30 into two parts, and then the separated water vapor intrusion channel is blocked by covering the waterproof layer 40 on the retaining wall part 32. Compared with the related art illustrated in FIG. 2, the embodiments of the present disclosure improve the encapsulation effect of the display panel and reduce the probability of water vapor intruding into the circuit unit 21. That is, the embodiments of the present disclosure may improve the encapsulation effect of the display panel while ensuring the protection effect of the first organic layer 30 on the circuit unit 21.

Furthermore, compared with the related art illustrated in FIG. 2, the embodiments of the present disclosure improve the encapsulation effect and do not need to increase a width of the sealant 51, and may further reduce the width of the sealant 51 according to requirements, which may facilitate narrow border of the display panel.

In some embodiments, a material of the waterproof layer 40 may include at least one of silicon nitride, silicon oxide, and aluminum oxide.

In some embodiments, the retaining wall part 32 may include one dam 321, and the waterproof layer 40 may continuously cover the dam 321 and a portion between the dam 321 and the first covering part 31, so as to improve the blocking effect of the waterproof layer 40 on the water vapor intrusion channel in the first organic layer 30.

In some embodiments, the retaining wall part 32 may include a plurality of dams 321, and the waterproof layer 40 may continuously cover the plurality of dams 321, portions between any two adjacent dams 321, and a portion between the first covering part 31 and the dam 321 adjacent to the first covering part 31, so as to improve the blocking effect of the waterproof layer 40 on the water vapor intrusion channel in the first organic layer 30.

Correspondingly, an orthographic projection of the sealant 51 on the first organic layer 30 may cover a part of one dam 321, or cover multiple dams 321, or cover all of the dams 321 and a part of the first covering part 31.

It can be understood that the larger the number of dams 321, the larger the range of the water vapor intrusion channel in the first organic layer 30 blocked by the waterproof layer 40, the greater the number of blocking times, and the better the encapsulation effect of the display panel. However, the increase in the number of dams 321 will also increase the difficulty and costs of the process. Therefore, the number of dams 321 may be selected according to actual needs.

In some embodiments, the waterproof layer 40 corresponds to the non-display area 101 and covers a surface of the first organic layer 30 away from the substrate 10.

In some embodiments, the waterproof layer 40 corresponds to the non-display area 101 and the display area, and covers the surface of the first organic layer 30 away from the substrate 10.

The second organic layer 60 is disposed on a side of the waterproof layer 40 away from the first organic layer 30. The second organic layer 60 includes a second covering part 61 and a filling part 62. The second covering part 61 is disposed in the display area and extends to the non-display area 101. The filling part 62 is located at least between the retaining wall part 32 and the first covering part 31.

It should be noted that the second organic layer 60 may be a pixel definition layer of the display panel, and the display panel further includes a plurality of anodes disposed between the first covering part 31 and the second covering part 61 and located in the display area. A plurality of pixel openings located in the display area are defined on the second covering part 61. The pixel openings correspond to the anodes, respectively.

In the embodiments of the present disclosure, the filling part 62 is disposed between the retaining wall part 32 and the first covering part 31, so as to provide protection for a part of the circuit unit 21 not covered by the first organic layer 30.

In some embodiments, on a condition that the retaining wall part 32 includes a plurality of dams 321, the filling part 62 may also be arranged between any two adjacent dams 321. The dams 321, the filling part 62, and the first covering part 31 may continuously provide protection for the circuit unit 21, so as to effectively improve the yield rate of the display panel.

Corresponding to an area between two adjacent dams 321 and an area between the first covering part 31 and the dam 321 adjacent to the first covering part 31, the waterproof layer 40 covers the surface of the circuit unit 21 away from the substrate 10. The filling part 62 is located on a surface of the waterproof layer 40 away from the circuit unit 21. Because the waterproof layer 40 covers the surface of the circuit unit 21, the water vapor intrusion channel in the first organic layer 30 may be completely blocked, and the water blocking effect may be maximized. Because the filling part 62 is located on the side of the waterproof layer 40 away from the circuit unit. 21, it may also protect the part of the circuit unit 21 not covered by the first organic layer 30. That is, in the embodiments of the present disclosure, the first organic layer 30, a stacking arrangement of the waterproof layer 40, and the second organic layer 60 may improve the encapsulation effect of the display panel and improve the yield rate of the display panel.

The cathode layer 80 is disposed on the second organic layer 60, and the encapsulation layer 70 is disposed on the cathode layer 80. The encapsulation layer 70 continuously covers the second organic layer 60 and the waterproof layer 40 to further enhance the encapsulation effect and the water blocking effect of the display panel.

In some embodiments, the encapsulation layer 70 may include an inorganic encapsulation layer, or a stacked structure of an inorganic encapsulation layer and an organic encapsulation layer.

In the embodiments of the present disclosure, the sealant 51 covers a surface of the encapsulation layer 70 away from the substrate 10 and overlaps with the retaining wall part 32. The filling glue 52 is filled in the enclosed area and covers the surface of the encapsulation layer 70 away from the substrate 10. The filling glue 52 and the sealant 51 together wrap the drive circuit layer 20, the first organic layer 30, the waterproof layer 40, the second organic layer 60, the cathode layer 80, and the encapsulation layer 70, so as to encapsulate the display panel.

Based on the above, in the embodiments of the present disclosure, the portion of the first organic layer 30 located in the non-display area 101 is divided into the first covering part 31 and the retaining wall part 32 arranged at intervals, so the portion of the first organic layer 30 located in the non-display area 101 is cut off. Because the first organic layer 30 is made of an organic material, it does not have a water blocking effect. In the embodiments of the present disclosure, the first covering part 31 and the retaining wall part 32 are arranged at intervals to break a water vapor intrusion channel, and the waterproof layer 40 is provided to cover the retaining wall part 32, so as to block the water vapor intrusion channel in the first organic layer 30, thereby effectively improving the encapsulation effect for the circuit unit 21. At the same time, a boundary of the circuit unit 21 is located within a coverage of the retaining wall part 32, thereby increasing a coverage of the first organic layer 30 to the circuit unit 21, which may ensure the protection effect of the first organic layer 30 on the circuit unit 21, and may further improve a yield rate of the display panel.

In addition, a manufacturing method of the display panel described in the above embodiments is provided according to embodiments of the present disclosure. Referring to FIG. 3, the manufacturing method of the display panel includes the following steps.

A substrate 10 is provided, and then a driving circuit layer 20 is formed on the substrate 10. The driving circuit layer 20 includes a pixel driving circuit formed in a display area of the display panel and a circuit unit 21 formed in a non-display area 101. The circuit unit 21 may include a GOA driving circuit.

A first organic material layer is formed on the driving circuit layer 20, and the first organic material layer is patterned to obtain a first covering part 31 and a retaining wall part 32. The first covering part 31 is located in the display area and extends to the non-display area 101. The retaining wall part 32 is located in a lateral side of the first covering part 31 away from the display area. The retaining wall part 32 is spaced apart from the first covering part 31, and the first covering part 31 and the retaining wall part 32 constitute a first organic layer 30.

In some embodiments, the retaining wall part 32 includes a plurality of dams 321, and an orthographic projection of the retaining wall part 32 on the driving circuit layer 20 covers a boundary of a side of the circuit unit 21 away from the display area.

An inorganic water blocking material is deposited on the first organic layer 30, and the inorganic water blocking material is etched to form a waterproof layer 40 located in the non-display area 101. The waterproof layer 40 covers the plurality of dams 321, portions between any two adjacent dams 321, and a portion between the first covering part 31 and the dam 321 adjacent to the first covering part 31.

A plurality of anodes are formed on the first organic layer 30 to be located in the display area.

A second organic material layer is formed on the waterproof layer 40, and the second organic material layer is patterned to obtain a second covering part 61 and a filling part 62. The second covering part 61 is located in the display area and extends to the non-display area 101. The filling part 62 is located on a lateral side of the second covering part 61 away from the display area. During the patterning process, a plurality of pixel openings are defined on a portion of the second covering part 61 located in the display area to respectively correspond to the plurality of anodes. The filling part 62 is located between any two adjacent dams 321 and between the first covering part 31 and the dam 321 adjacent to the first covering part 31. The second covering part 61 and the filling part 62 constitute a second organic layer 6.

A light emitting functional layer and a cathode layer 80 are formed on the second organic layer 60.

Then, an encapsulation layer 70 is formed on the second organic layer 60 to cover the light emitting functional layer, the cathode layer 80, the second organic layer 60, and the waterproof layer 40.

A frame glue is coated on a boundary area of the substrate 10 to form a sealant 51. The sealant 51 covers a side of the encapsulation layer 70 away from the substrate 10. An orthographic projection of the sealant 51 on the substrate 10 and an orthographic projection of the retaining wall part 32 on the substrate 10 are overlapped.

A filling glue 52 is filled in an enclosed area surrounded by the sealant 51, and then a package substrate 53 is bonded on a side of the filling glue 52 away from the substrate 10 and a side of the sealant 51 away from the substrate 10, so as to obtain the display panel.

Based on the above, in the embodiments of the present disclosure, the portion of the first organic layer 30 located in the non-display area 101 is divided into the first covering part 31 and the retaining wall part 32 arranged at intervals, so the portion of the first organic layer 30 located in the non-display area 101 is cut off. Because the first organic layer 30 is made of an organic material, it does not have a water blocking effect. In the embodiments of the present disclosure, the first covering part 31 and the retaining wall part 32 are arranged at intervals to break a water vapor intrusion channel, and the waterproof layer 40 is provided to cover the retaining wall part 32, so as to block the water vapor intrusion channel in the first organic layer 30, thereby effectively improving the encapsulation effect for the circuit unit 21. At the same time, a boundary of the circuit unit 21 is located within a coverage of the retaining wall part 32, thereby increasing a coverage of the first organic layer 30 to the circuit unit 21, which may ensure the protection effect of the first organic layer 30 on the circuit unit 21, and may further improve a yield rate of the display panel.

In addition, display devices are further provided according to the embodiments of the present disclosure. The display device includes a main body and the display panel as described in the above embodiments. The main body and the display panel are combined into one body.

In the foregoing embodiments, the descriptions of each embodiment have their own emphases, and for parts not described in detail in a certain embodiment, reference may be made to relevant descriptions of other embodiments.

The above is a detailed introduction of the display panel and the display device provided by the embodiments of the present disclosure. In this paper, specific examples are used to illustrate the principles and implementation methods of the present disclosure. The description of the above embodiments is only used to help understand technical solutions and their core ideas of the present disclosure. Those of ordinary skill in the art should understand that: it is still possible to modify the technical solutions recorded in the foregoing embodiments, or perform equivalent replacements for some of the technical features; and these modifications or replacements do not make the essence of the corresponding technical solutions depart from the scope of the technical solutions of the embodiments of the present disclosure.

What is claimed is:

1. A display panel, comprising a display area and a non-display area, and comprising:

a substrate;

a driving circuit layer, disposed on the substrate and comprising a circuit unit arranged in the non-display area;

a first organic layer, comprising a first covering part and a retaining wall part both disposed on a side of the circuit unit away from the substrate, wherein the first covering part is disposed in the display area and extends to the non-display area, and the retaining wall part is disposed on a lateral side of the first covering part away from the display area and spaced apart from the first covering part;

a waterproof layer, covering the retaining wall part;

a second organic layer disposed on a side of the waterproof layer away from the first organic layer; and a sealant, disposed in the non-display area and on a side of the driving circuit layer away from the substrate and a side of the waterproof layer away from the substrate, wherein an orthographic projection of the sealant on the substrate overlaps with an orthographic projection of the retaining wall part on the substrate, and an orthographic projection of an end of the circuit unit away from the display area on the substrate is located within the orthographic projection of the retaining wall part on the substrate;

wherein the retaining wall part comprises a plurality of dams, and the waterproof layer continuously covers the plurality of dams, portions between any two adjacent ones of the dams, and a portion between the first covering part and one of the dams adjacent to the first covering part; and the second organic layer comprises a second covering part and a filling part, the second covering part is disposed in the display area and extends to the non-display area, the filling part is disposed on a lateral side of the second covering part away from the display area, and the filling part is disposed between any two adjacent ones of the dams and between the first covering part and the one of the dams adjacent to the first covering part.

2. The display panel according to claim 1, wherein between any two adjacent ones of the dams and between the first covering part and the one of the dams adjacent to the first covering part, the waterproof layer covers the side of the circuit unit away from the substrate, and the filling part is disposed on a side of the waterproof layer away from the circuit unit.

3. The display panel according to claim 1, further comprising an encapsulation layer disposed on a side of the second organic layer away from the waterproof layer, wherein the encapsulation layer continuously covers the second organic layer and the waterproof layer.

4. The display panel according to claim 3, wherein the sealant partially covers a surface of the encapsulation layer away from the substrate.

5. The display panel according to claim 3, further comprising a cathode layer disposed on a side of the second organic layer away from the waterproof layer, wherein the encapsulation layer is disposed on a side of the cathode layer away from the waterproof layer and the side of the second organic layer away from the waterproof layer.

6. The display panel according to claim 1, further comprising a plurality of anodes disposed in the display area and between the first covering part and the second covering part, wherein a plurality of pixel openings are defined on the second covering part, and the plurality of pixel openings correspond to the plurality of anodes, respectively.

7. The display panel according to claim 1, wherein the waterproof layer corresponds to the non-display area and covers a side of the first organic layer away from the substrate.

8. The display panel according to claim 1, wherein a material of the waterproof layer comprises at least one of silicon nitride, silicon oxide, and aluminum oxide.

9. The display panel according to claim 1, further comprising a package substrate disposed opposite to the substrate, wherein the sealant is arranged between the substrate and the package substrate and is located in a boundary area, an enclosed area is defined between the substrate and the package substrate and surrounded by the sealant, and a filling glue is filled in the enclosed area.

10. The display panel according to claim 1, wherein the driving circuit layer further comprises a wiring unit on a lateral side of the circuit unit away from the display area, and the orthographic projection of the sealant on the substrate covers an orthographic projection of the wiring unit on the substrate.

11. A display device, comprising a display panel, wherein the display panel comprises a display area and a non-display area, and comprises:

a substrate;

a driving circuit layer, disposed on the substrate and comprising a circuit unit arranged in the non-display area;

a first organic layer, comprising a first covering part and a retaining wall part both disposed on a side of the circuit unit away from the substrate, wherein the first covering part is disposed in the display area and extends to the non-display area, and the retaining wall part is disposed on a lateral side of the first covering part away from the display area and spaced apart from the first covering part;

a waterproof layer, covering the retaining wall part;

a second organic layer disposed on a side of the waterproof layer away from the first organic layer; and a sealant, disposed in the non-display area and on a side of the driving circuit layer away from the substrate and a side of the waterproof layer away from the substrate, wherein an orthographic projection of the sealant on the substrate overlaps with an orthographic projection of the retaining wall part on the substrate, and an orthographic projection of an end of the circuit unit away from the display area on the substrate is located within the orthographic projection of the retaining wall part on the substrate;

wherein the retaining wall part comprises a plurality of dams, and the waterproof layer continuously covers the plurality of dams, portions between any two adjacent ones of the dams, and a portion between the first covering part and one of the dams adjacent to the first covering part; and the second organic layer comprises a second covering part and a filling part, the second covering part is disposed in the display area and extends to the non-display area, the filling part is disposed on a lateral side of the second covering part away from the display area, and the filling part is disposed between any two adjacent ones of the dams and between the first covering part and the one of the dams adjacent to the first covering part.

12. The display device according to claim 11, wherein between any two adjacent ones of the dams and between the first covering part and the one of the dams adjacent to the first covering part, the waterproof layer covers the side of the circuit unit away from the substrate, and the filling part is disposed on a side of the waterproof layer away from the circuit unit.

13. The display device according to claim 11, wherein the display panel comprises an encapsulation layer disposed on a side of the second organic layer away from the waterproof layer, the encapsulation layer continuously covers the second organic layer and the waterproof layer.

14. The display device according to claim 13, wherein the sealant partially covers a surface of the encapsulation layer away from the substrate.

15. The display device according to claim 13, wherein the display panel further comprises a cathode layer disposed on a side of the second organic layer away from the waterproof layer, wherein the encapsulation layer is disposed on a side of the cathode layer away from the waterproof layer and the side of the second organic layer away from the waterproof layer.

16. The display device according to claim 11, wherein the display panel comprises a package substrate disposed opposite to the substrate, the sealant is arranged between the substrate and the package substrate and is located in a boundary area, an enclosed area is defined between the substrate and the package substrate and surrounded by the sealant, and a filling glue is filled in the enclosed area.

17. The display device according to claim 11, wherein the display panel further comprises a plurality of anodes disposed in the display area and between the first covering part and the second covering part, wherein a plurality of pixel openings are defined on the second covering part, and the plurality of pixel openings correspond to the plurality of anodes, respectively.

18. The display device according to claim 11, wherein the waterproof layer corresponds to the non-display area and covers a side of the first organic layer away from the substrate.

19. The display device according to claim 11, wherein a material of the waterproof layer comprises at least one of silicon nitride, silicon oxide, and aluminum oxide.

20. The display device according to claim 11, wherein the driving circuit layer further comprises a wiring unit on a lateral side of the circuit unit away from the display area, and the orthographic projection of the sealant on the substrate covers an orthographic projection of the wiring unit on the substrate.

* * * * *